United States Patent [19]
Engh et al.

[11] Patent Number: 5,926,409
[45] Date of Patent: Jul. 20, 1999

[54] METHOD AND APPARATUS FOR AN ADAPTIVE RAMP AMPLITUDE CONTROLLER IN NONVOLATILE MEMORY APPLICATION

[75] Inventors: Lawrence D. Engh, Redwood City; May Lee, San Jose, both of Calif.

[73] Assignee: Information Storage Devices, Inc., San Jose, Calif.

[21] Appl. No.: 08/924,284

[22] Filed: Sep. 5, 1997

[51] Int. Cl.⁶ .................................................. G11C 27/00
[52] U.S. Cl. ................ 365/45; 365/185.03; 365/185.19; 365/185.21
[58] Field of Search .................................. 365/45, 185.03, 365/210, 185.19, 185.21; 327/561

[56] References Cited

U.S. PATENT DOCUMENTS

| | | |
|---|---|---|
| 4,890,259 | 12/1989 | Simko . |
| 4,989,179 | 1/1991 | Simko . |
| 5,220,531 | 6/1993 | Blyth et al. . |
| 5,241,494 | 8/1993 | Blyth et al. ............................. 365/210 |
| 5,475,339 | 12/1995 | Maida ...................................... 327/561 |
| 5,623,436 | 4/1997 | Sowards et al. . |
| 5,629,890 | 5/1997 | Engh . |
| 5,754,470 | 5/1998 | Engh et al. .......................... 365/185.03 |

*Primary Examiner*—David Nelms
*Assistant Examiner*—David Lam
*Attorney, Agent, or Firm*—Blakely, Sokoloff, Taylor & Zafman LLP

[57] ABSTRACT

An adaptive amplitude ramp controller that regulates how fast and how high a series of voltages is applied to a targeted non-volatile memory cell. The series of voltages include a coarse ramp pulse and at least one fine ramp pulse. The coarse ramp pulse undergoes a first ramp rate until a particular voltage is reached. Thereafter, it undergoes a second ramp rate until the cycle associated with the coarse ramp pulse is completed or a target voltage is reached. Programming of the non-volatile memory cell occurs during this portion of the course ramp pulse. Thereafter, the adaptive amplitude ramp controller produces at least one fine ramp pulse. The fine ramp pulse is quickly ramped up at a third ramp rate and then undergoes a fourth ramp rate until the final desired voltage of the non-voltage memory cell is generally reached.

39 Claims, 6 Drawing Sheets

METHOD AND APPARATUS FOR AN ADAPTIVE RAMP AMPLITUDE CONTROLLER IN NONVOLATILE MEMORY APPLICATION

BACKGROUND OF THE INVENTION

1. Field of the Invention

The present invention relates to the field of analog storage devices. More particularly, this invention relates to a circuit and method for controlling the application of programming voltages applied to non-volatile memory cells.

2. Description of Prior Art

Currently, various analog storage devices are designed with multiple column drivers, each responsible for applying programming voltage to a drain of a corresponding non-volatile memory cell or a corresponding column of nonvolatile memory cells situated in the analog storage device. As seen in conventional analog storage devices such as ISD1016™ sold by Information Storage Devices, Inc. of San Jose, Calif., assignee of the present invention, multiple column drivers are used for parallel programming of an array of nonvolatile memory cells as described in U.S. Pat. Nos. 5,220,531 and 5,623,436.

Figure 1:
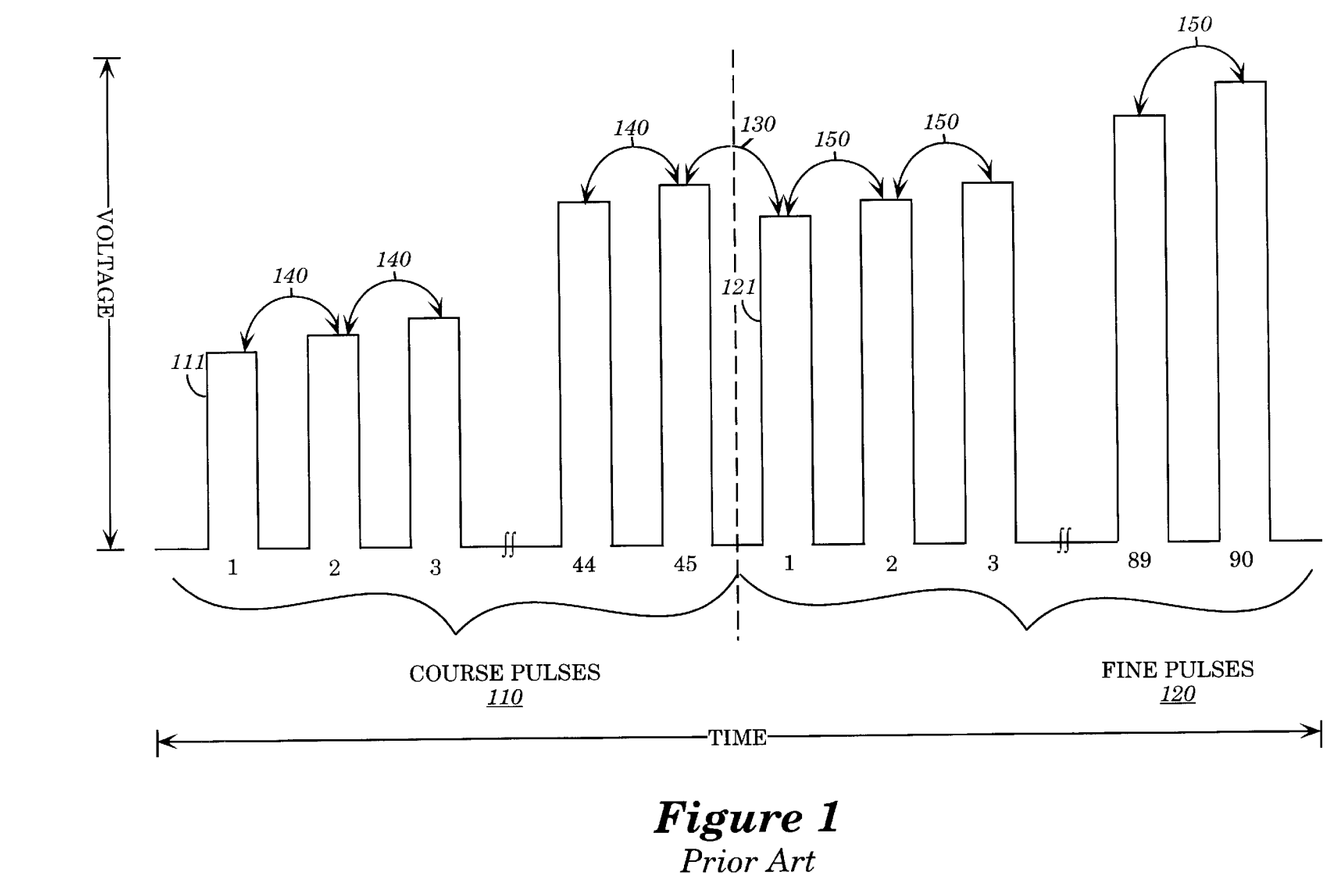
FIG. 1 is a block diagram of conventional analog voltage programming of a non-volatile memory element.

For example, as described in U.S. Pat. No. 5,623,436, conventional analog storage devices involve a complex, multi-iterative programming technique in which a plurality of column drivers are used to program a corresponding plurality of non-volatile (NV) memory cells. These column drivers share a common high voltage supply source which provides two bursts of voltage pulses to program multiple NV memory cells. As shown in FIG. 1, the first burst includes forty-five coarse pulses 110 which are monotonically increasing in voltage levels, starting at a voltage level which produces a weakly programmed memory cell and ending at a voltage level which produces a stronger programmed memory cell (ranging from 8–18 volts). The second burst includes ninety fine pulses 120 which are monotonically increasing in voltage level. However, the first fine pulse 121 starts at a voltage level of the last coarse pulse applied to the NV memory cell minus a step-back voltage ($V_{stepback}$) 130. $V_{stepback}$ 130 is approximately two volts (2V). The fine pulse programming continues until the NV memory cell is programmed to a desired voltage level.

Figure 2:
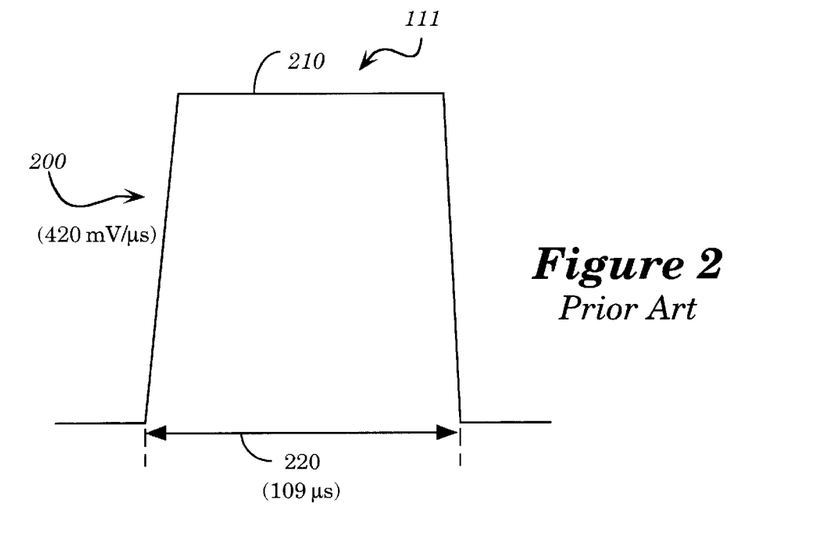
FIG. 2 is a block diagram of a conventional coarse pulse during programming of the non-volatile memory element of FIG. 1.

As shown in FIG. 2, each of the coarse pulses 110 (e.g., the first coarse pulse 111 of FIG. 1) is configured with a constant initial ramp rate 200 equal to 420 millivolts per microsecond (mV/µs) until reaching a maximum voltage 210 associated with that coarse pulse 111. The pulse width of each coarse pulse, including pulse width 220 of first coarse pulse 111, is set to a constant time span preferably equal to 109 microseconds (µs). Successive coarse pulses monotonically increase by a first incremental step voltage ($V_{step1}$) 140 of 200 mV as shown in FIG. 1. This step voltage is required to cover a full voltage range of cell programming on a drain of the NV memory cell.

Each coarse pulse is initially applied to the corresponding NV memory cell and the content of that cell is subsequently read during a read operation in order to ascertain its present voltage level. Thereafter, the present voltage level is compared to a target voltage associated with an analog signal to be stored. If it is determined that an additional coarse pulse would place the NV memory cell at a voltage level greater than the target voltage (referred to as "over programming"), the remaining coarse pulses are not applied to the drain of the NV memory cell. This may be accomplished by temporarily disabling an interconnection between a voltage supply source and the drain of the NV memory cell. The remaining coarse pulses, however, will continue programming other NV memory cells.

Figure 3:
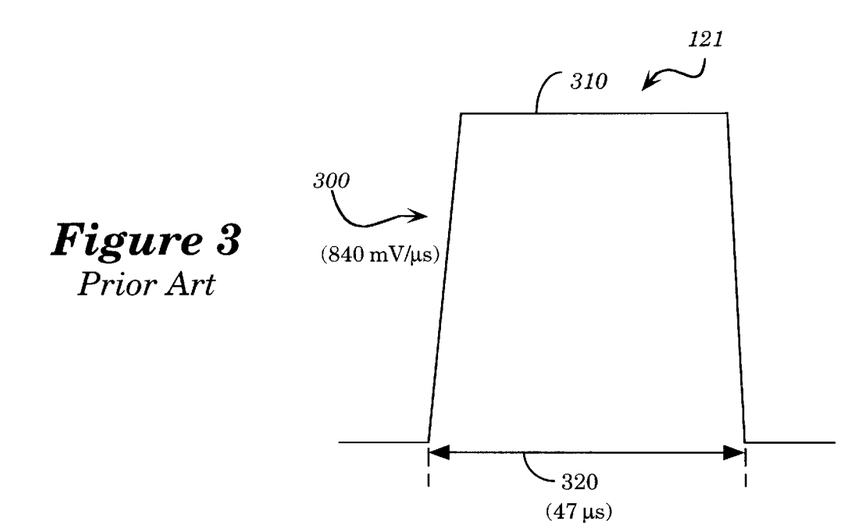
FIG. 3 is a block diagram of a conventional fine pulse during programming of the non-volatile memory element of FIG. 1.

Similar to coarse pulses 110, the fine pulses 120 of FIG. 1 are monotonically increasing in voltage; however, fine pulses 120 have an incremental voltage less than that associated with coarse pulses 110. As shown in FIG. 3, each fine pulse (e.g., first fine pulse 121 of FIG. 1) has an initial ramp rate 300 of 840 mV/µs and a constant maximum voltage 310 being lower than the voltage of the final coarse pulse applied. The successive fine pulses are monotonically increasing by a second step voltage ($V_{step2}$) 150 having an incremental step voltage of 22 mV as shown in FIG. 1. This enables more refined programming of the NV memory cell to increase resolution of analog storage playback. However, certain remaining fine pulses will not be applied to the drain of the NV memory cell once it is determined that an additional fine pulse would cause the NV memory cell to be over programmed.

In view of the above configuration, the number of column drivers required for parallel programming of NV memory cells is defined by the sampling rate together with the cell programming time. For example, for a sampling rate of 8 kilohertz (KHz) for a typical voice signal and a cell programming time of 12.5 ms, the number of column drivers required was approximately 100. Thus, cell programming occurs for 100 columns at a time.

It is contemplated, however, that this conventional programming scheme possess a number of disadvantages. For example, this scheme is quite complex and slow due to the step-by-step application of incremental programming voltages through a maximum of 45 coarse pulses and 90 fine pulses. In those situations where coarse pulses or fine pulses are generated but are not used during programming, the analog storage device is needlessly consuming power. Moreover, to support this conventional programming scheme, a substantial amount of additional circuitry is required such as a large number of column drivers. This additional circuitry poses a greater likelihood of device failure and an inefficient use of die area.

SUMMARY OF THE INVENTION

The present invention relates to an adaptive ramp amplitude controller that regulates how fast and how high a series of voltages is applied to a targeted non-volatile memory cell. The series of voltages include a coarse ramp pulse and at least one fine ramp pulse. The coarse ramp pulse undergoes a first ramp rate until a particular voltage is reached. Thereafter, it undergoes a second ramp rate until the cycle associated with the coarse ramp pulse is completed or a target voltage is reached. Thereafter, the adaptive ramp amplitude controller produces at least one fine ramp pulse. The fine ramp pulse is quickly ramped up at a third ramp rate and then undergoes a fourth ramp rate until the final desired voltage of the non-voltage memory cell is generally reached. An embodiment of the circuitry associated with the adaptive ramp amplitude controller and its relationship with driver circuitry to control the amount of voltages applied to a memory cell are described herein in detail.

BRIEF DESCRIPTION OF THE DRAWINGS

The features and advantages of the present invention will become apparent from the following detailed description of the present invention in which.

DESCRIPTION OF THE PREFERRED EMBODIMENT

In the following description, for purposes of explanation, specific details are set forth in order to provide a thorough understanding of the present invention. However, it will be apparent to one skilled in the art of circuit design that the present invention may be practiced without these specific details. In other instances, well known operations, functions and devices are not shown in order to avoid obscuring the present invention.

Herein, a number of terms are frequently used to describe characteristics of the present invention. For example, the term "asserted" (other its possible tenses) is defined herein as applying the voltage associated with an active-high signal to turn-on a transistor or applying the voltage associated with an active-low signal to turn-off a transistor. Of course, the term "deasserted" has an opposite meaning as "asserted".

Figure 4:
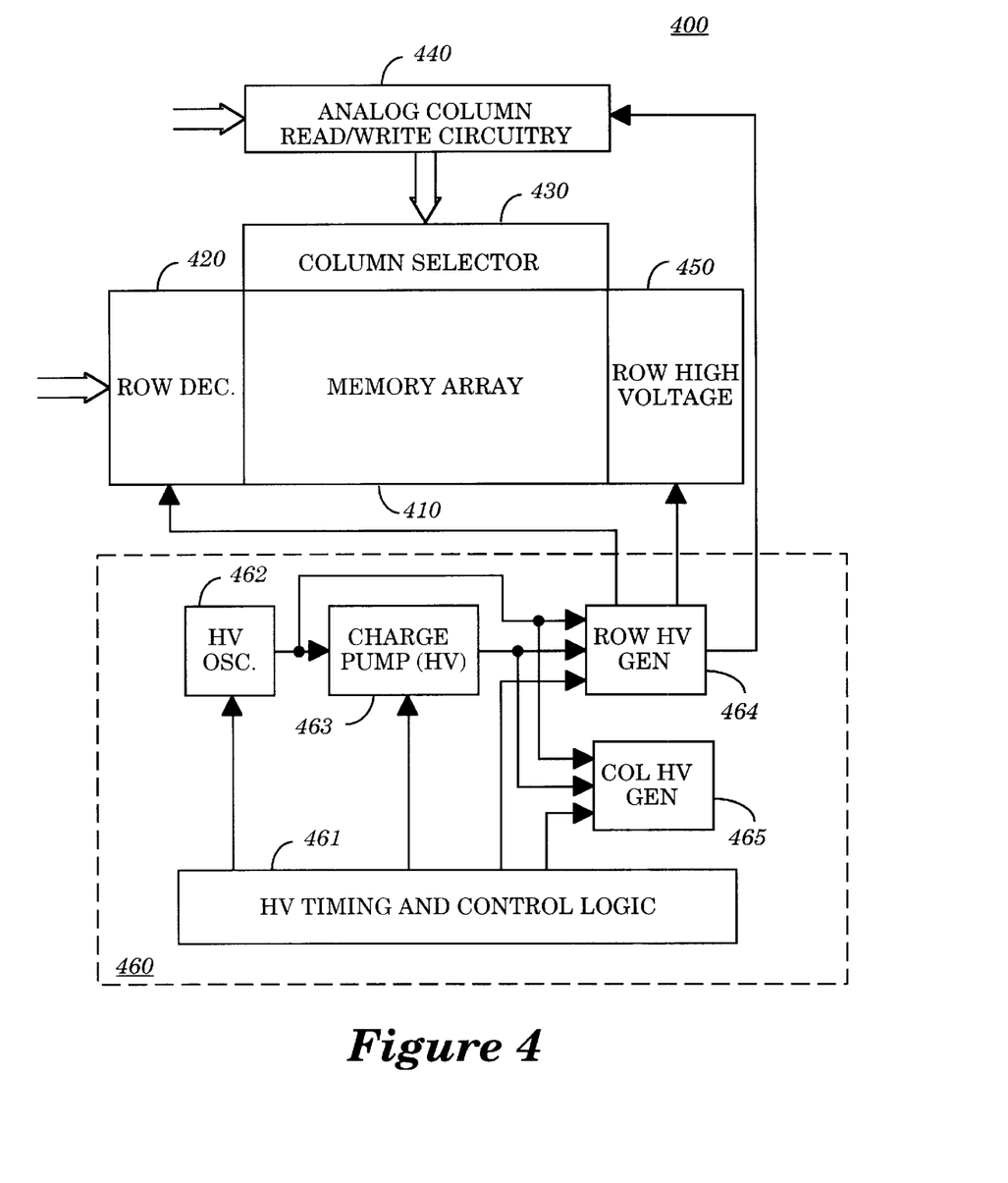
FIG. 4 is an illustrative block diagram of an analog integrated circuit storage device implemented with an adaptive ramp amplitude controller.

Referring to FIG. 4, an illustrative embodiment of an analog integrated circuit (IC) storage device utilizing the present invention is illustrated. The analog IC storage device 400 comprises a memory array 410 interconnected to a (i) row decoder 420, (ii) a column selector 430 and analog column read/write circuitry 440 and (iii) a row high voltage circuit 450. Central to the analog IC storage device 400, memory array 410 has "X" rows and "Y" columns of nonvolatile (NV) memory cells, where "X" and "Y" are positive whole numbers. Preferably, memory array 410 includes 512 columns each having a plurality of electrically erasable programmable read only memory (EEPROM) cells. It is contemplated, however, that the NV memory cells could be another type of NV memory such as flash memory. These NV memory cells are accessed under page mode addressing in which row decoder 420, column selector 430 and analog column read/write circuitry 440 are used to select the particular row and column of the NV memory cell targeted for access (referred to as the "targeted NV memory cell").

A high voltage generator circuit 460 generates programming voltages supplied to row decoder 420 and analog column read/write circuitry 440. The high voltage generator circuit 460 further generates erasing voltage to row decoder 420 and row high voltage circuit 450. High voltage generator circuit 460 includes high voltage timing and logic circuit 461 coupled to a high voltage oscillator 462, a charge pump 463, a row high voltage generator 464 and a column high voltage generator 465. The timing and logic circuit 461 provides timing signals used for programming and erasing purposes. High voltage oscillator 462 is coupled to charge pump 463, row high voltage generator 464 and column high voltage generator 465 for assisting high voltage generation. More specific to the present invention, charge pump 463 applies a constant voltage to both row high voltage generator 464 and column high voltage generator 465. Column high voltage generator 465 includes an adaptive ramp amplitude controller (not shown) which controls a ramp rate and amplitude of voltages applied to the targeted NV memory cell by analog column read/write circuitry 440.

Figure 5:
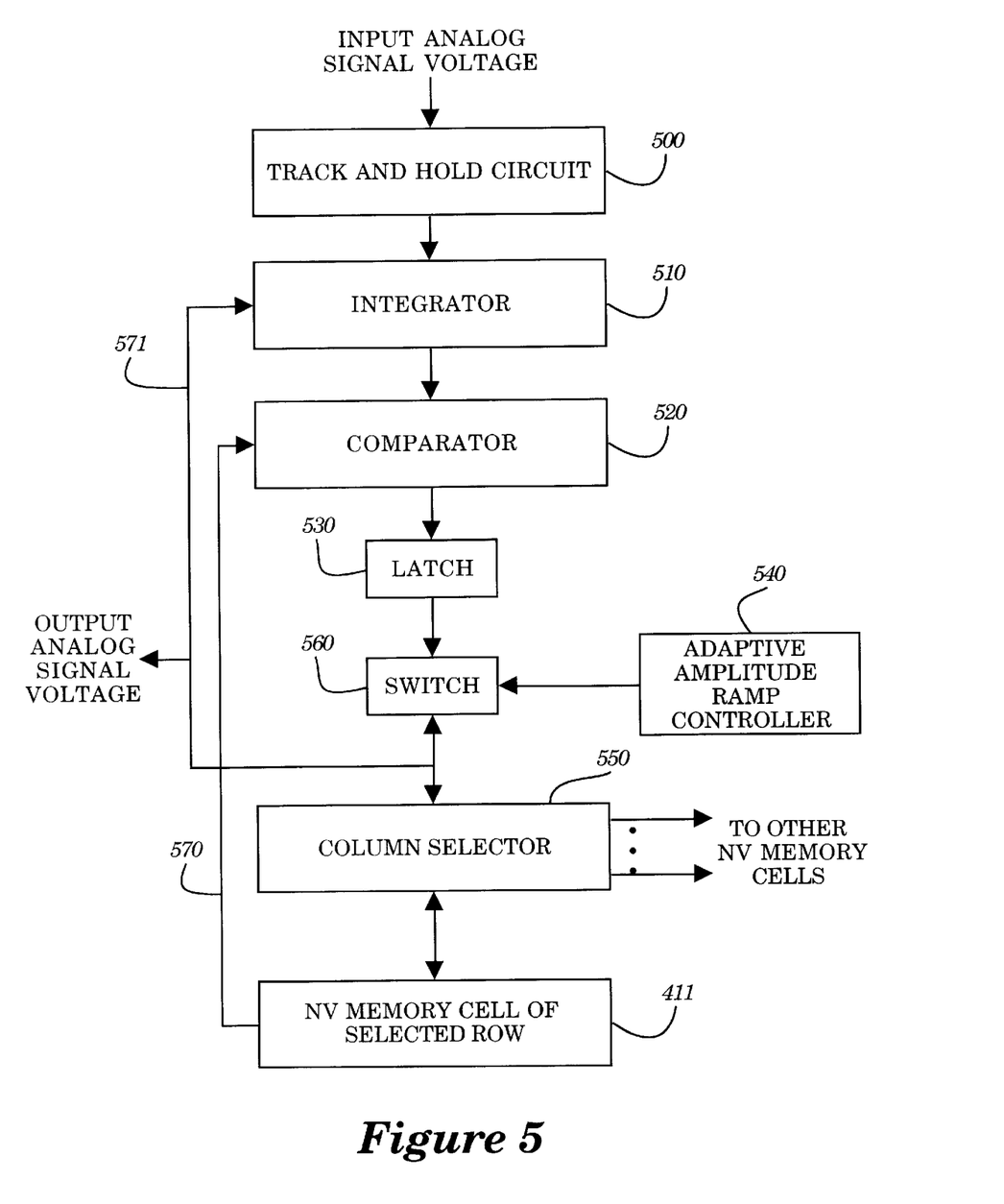
FIG. 5 is an illustrative block diagram of the adaptive ramp amplitude controller operating in combination with the analog column read/write circuitry of FIG. 4.

Referring now to FIG. 5, an illustrative embodiment of the adaptive ramp amplitude controller operating in conjunction with the analog column read/write circuitry 440 is shown. The analog column read/write circuitry 440 includes a column driver featuring a track and hold circuit 500, an integrator 510, a comparator 520, and a latch 530. The targeted NV memory cell 411 of memory array 410 of FIG. 4 is connected to the adaptive ramp amplitude controller 540 through a column selector 550 and a switch 560. The output of latch 530 is connected to switch 560 for controlling the application of high voltage to targeted NV memory cell 411 during a reduced series of coarse and fine ramp pulses in accordance with the present invention. The column selector 550 is a 1:Y multiplexer to enable programming of any memory cell along Y columns of memory array 410 of FIG. 4. The column is selected by column selector 430 of FIG. 4.

During a read-while-writing operation described in U.S. Pat. No. 5,629,890 issued to Information Storage Devices, Inc., track and hold circuit 500 samples an input voltage of an analog input signal desired to be recorded. Track and hold circuit 500 holds the analog input signal at a fixed voltage to which targeted NV memory cell 411 is to be set. The sampled voltage is transmitted to integrator 510 which operates to determine an initial target voltage applied to memory cell 411. The initial target voltage is set to a voltage less than the sampled input voltage such as, for example, ninety percent (90%) of the sampled input voltage.

Thereafter, the initial target voltage is transmitted to comparator 520 which compares the initial target voltage to a present voltage held in memory cell 411 upon being programmed by a single coarse ramp pulse described below. The present voltage is provided through a communication line 570. As long as comparator 520 determines that the initial target voltage is greater than the present voltage of targeted NV memory cell 411, comparator 520 continues to signal latch 530 to maintain switch 560 in a closed state. This maintains a connection between adaptive ramp amplitude controller 540 and memory cell 411. However, when comparator 520 determines that the present voltage reaches the initial target voltage, comparator 520 signals latch 530 to place switch 560 in an open state. This disconnects adaptive ramp amplitude controller 540 from targeted NV memory cell 411.

Thereafter, a normal read operation is performed on targeted NV memory cell 411 and its actual stored voltage is conveyed along communication line 571 to integrator 510. Integrator 510 operates to determine a new target voltage based on the initial target voltage plus a prescribed percentage of the remaining difference between the sampled voltage and the actual stored voltage provided along communication line 571 (e.g., 90% of the of the remaining difference). Thus, in this example, the new target voltage would be equivalent to approximately 99% of the sampled voltage.

Thereafter, the new target voltage is applied to comparator 520 and the foregoing steps are repeated to apply a first fine ramp pulse to memory cell 411 for increasing the voltage therein to approach the new target voltage. Once memory cell 411 reaches the new target voltage, latch 530 again operates to open switch 560 thereby preventing the high voltage ramp from further programming memory cell 411. This process is iterative in the fine cycle for successive fine ramp pulses. Thereafter, the targeted NV memory cell has been programmed and another NV memory cell is selected for programming.

Figure 6:
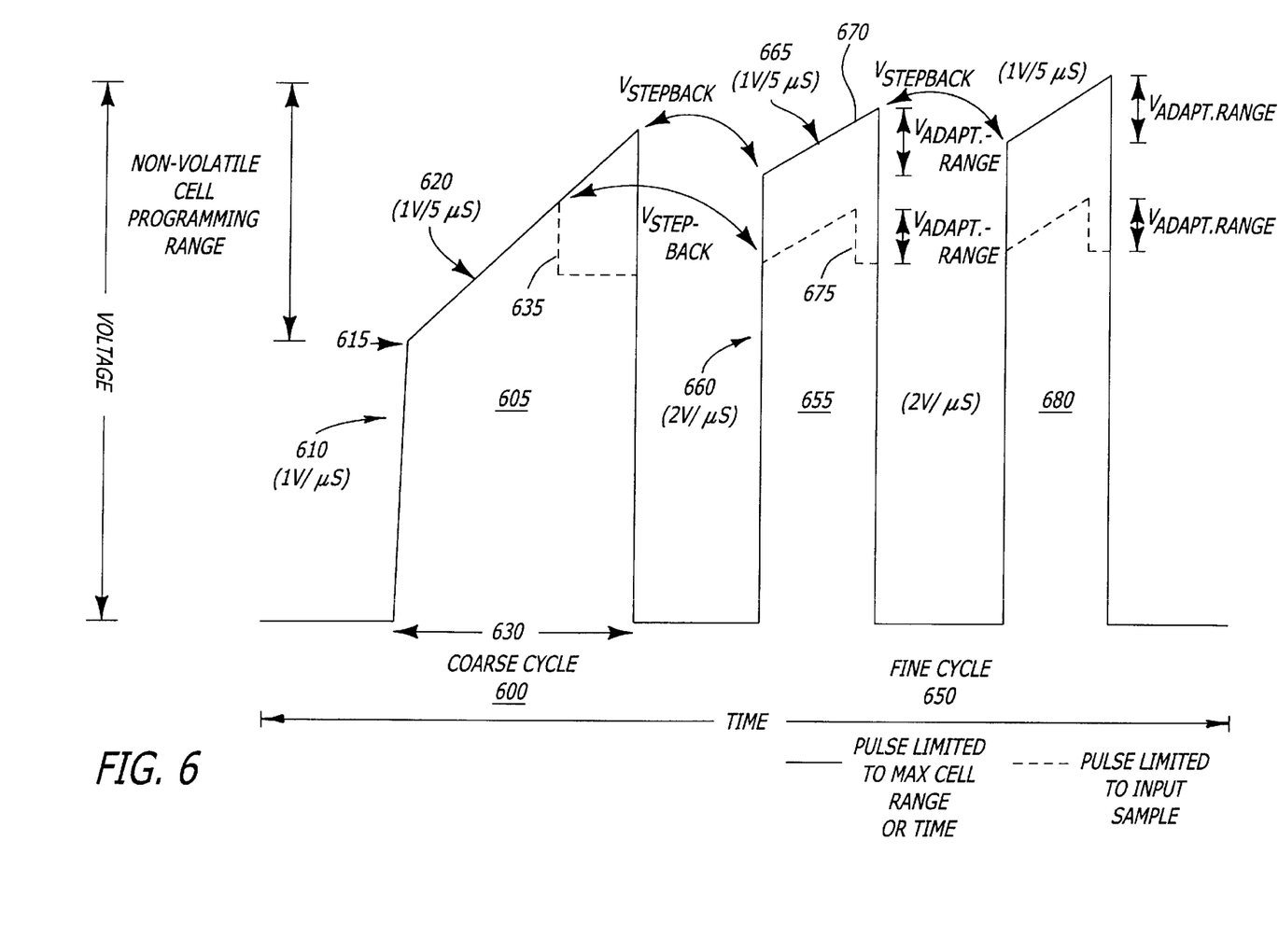
FIG. 6 is an illustrative block diagram of voltage programming of a nonvolatile memory element using the adaptive ramp amplitude controller of FIG. 4.

Referring now to FIG. 6, the operations of the adaptive ramp amplitude controller in controlling a ramp rate and amplitude of output voltage applied to a targeted NV memory cell of the memory array are described. Various selected ramp rates and voltage levels are described. It is well-known that tunnel oxide reliability and endurance of the targeted NV memory cell will be affected if the voltage is applied too fast. Likewise, if the voltage level used for cell programming is too high, the targeted NV memory cell tends to be over programmed.

As shown, each NV memory cell is programmed through a series of programming cycles including a coarse cycle 600 and a fine cycle 650. Preferably, in this embodiment, it is contemplated that "coarse cycle" 600 includes a single ramp coarse pulse 605 and "fine cycle" 650 includes at least one fine ramp pulse although two fine ramp pulses 655 and 680 are shown for illustrative purposes. Defined herein, a "coarse ramp pulse" is an increasing ramp voltage generally ranging in voltage from a voltage level where cell programming begins until an initial target voltage is reached. A "fine ramp pulse" is an increasing ramp voltage ranging from a voltage level related to the most recent voltage applied to a NV memory cell to the maximum voltage level to be applied to the NV memory cell.

Initially, coarse ramp pulse 605 is produced by the adaptive ramp amplitude controller. As shown, the voltage level of coarse ramp pulse 605 is initially increased at a first ramp rate 610 until a selected voltage level 615 is reached. This selected voltage level 615 is typically the point where the targeted NV memory cell starts to program such as approximately 7V for example. The first ramp rate is approximately 1 V/$\mu$s although another lesser or greater ramp rate may be used.

Upon reaching the selected voltage level 615, the voltage level of coarse ramp pulse 605 is increased at a second ramp rate 620 (approximately 0.2 V/$\mu$s although other ramp rates dependent on time allocated for cell programming and cell characteristics may be used) until one of two conditions occurs. The normal operation is the second condition (described below) where the NV memory cell reaches a target voltage.

The first condition is where the cycle associated with the coarse ramp pulse 605 has been completed as represented by solid lines 625. This occurs after coarse programming has been performed for a time duration equivalent to a selected pulse width 630 of coarse ramp pulse 605 (with the assumption that the target voltage has been reached) and is determined by deassertion of COARSE as described below. This time duration is equivalent to approximately 52 $\mu$s although it is contemplated that another time duration may be utilized.

Represented by dashed lines 635 in FIG. 6, the second condition is where a determination is made that the NV memory cell has reached an initial target voltage. If this condition occurs, the adaptive ramp amplitude controller receives a control signal (e.g., an asserted LATCH signal as described below) from comparator 520 of FIG. 5. This halts the adaptive ramp amplitude controller from further programming the targeted NV memory cell at the second ramp rate and causes the output voltage provided by the adaptive ramp amplitude controller (see FIG. 7) to realize a voltage reduction. This reduced output voltage is maintained until the end of the coarse cycle is reached as detected by deassertion of a course end (COARSE) signal.

Figure 7:
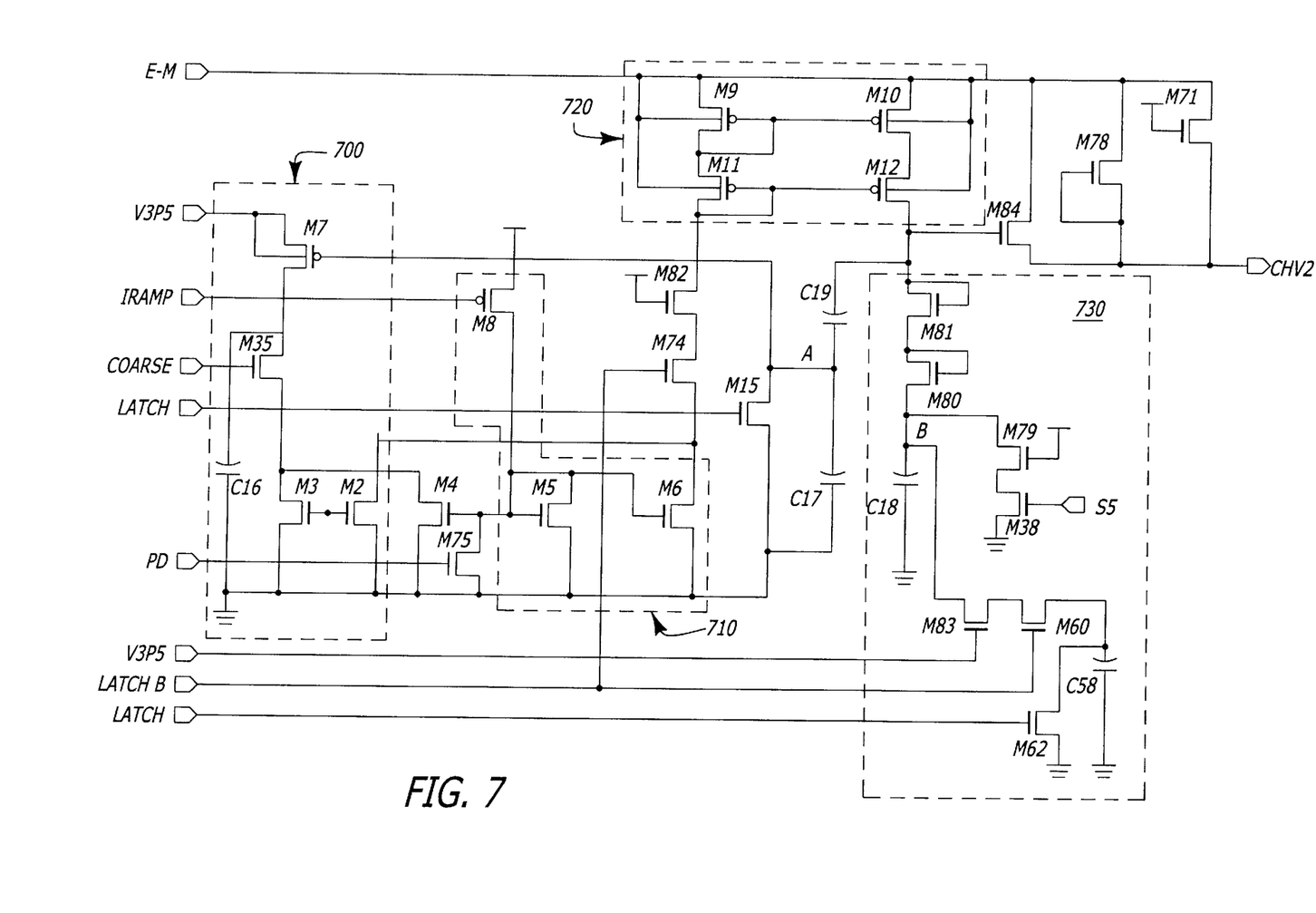
FIG. 7 is an illustrative circuit schematic of the adaptive ramp amplitude controller of FIG. 4.

Concurrently, the adaptive ramp amplitude controller includes a memory circuit which stores a voltage realized when the comparator has disabled the adaptive ramp amplitude controller as described in more detail in FIG. 7. This voltage value is approximately a stepback voltage ($V_{stepback}$) lower than the actual stop voltage in order to protect the targeted NV memory cell from being over programmed in the succeeding fine cycle. In this embodiment, $V_{stepback}$ is approximately 1V although another voltage may be used.

When the analog IC storage device begins the fine cycle 650, a first fine ramp pulse 655 initially increases at a third ramp rate 660. Preferably, the third ramp rate 660 is approximately equal to 2V/$\mu$s. It is contemplated that another ramping rate may be appropriate, provided third ramp rate 660 is greater than the first ramp rate 610. Upon reaching the stored voltage value, the adaptive ramp amplitude controller adjusts the ramping rate of first fine ramp pulse 655 from third ramp rate 660 to a fourth ramp rate 665. In this embodiment, fourth ramp rate 665 is equal to second ramp rate 620 of approximately 0.2V/$\mu$s although it is contemplated that a lesser or greater ramp voltage may be used.

Similar to the coarse pulse programming, voltage programming by first fine ramp pulse 655 continues until one of two conditions occurs; namely, the normal operation where the new target voltage (based on the initial target voltage as described in FIG. 5) is reached before completion of first fine ramp pulse 655 or the cycle associated with first fine ramp pulse 655 (e.g., 20 $\mu$s) has completed. Herein, for clarity sake, the first condition is represented by solid lines 670 in association with prior coarse ramp pulse 605 being completed. The second condition is represented by dashed lines 675 in association with the initial targeted voltage being reached before coarse cycle 600 has finished.

If the second condition occurs, the adaptive ramp amplitude controller receives the LATCH signal (described below) which halts the adaptive ramp amplitude controller from further programming the NV memory cell at the second ramp rate and causes a voltage reduction in the output voltage. This reduced output voltage is maintained until the end of the cycle for the first fine ramp pulse 655 is reached. Additionally, the voltage value realized upon disablement of the adaptive ramp amplitude controller is lower than the $V_{stepback}$ voltage.

The same procedure described for first fine ramp pulse 655 occurs for the second fine ramp pulse 680. As shown, each cycle of fine ramp pulses 650 and 680 adapt to a starting voltage related to and less than the highest voltage of the previous ramp pulse (coarse or fine). This adaptive ramping behavior permits automatic adjustments of start-up voltages for the cycles of the fine ramp pulses over a wide range of sampled data.

Referring now to FIG. 7, an illustrative schematic diagram of the adaptive ramp amplitude controller 540 of FIG. 5 is shown. The adaptive ramp amplitude controller 540 includes a first current source 700, a second current source 710, a current mirror 720, a memory element 730 and various control circuitry used to ensure proper voltage ramping of one or more series of coarse and fine ramp pulses. In this embodiment, first current source 700 includes transistors M7, M35, M3, M2 and capacitor C16. The second current source 710 includes transistors M8, M5 and M6 with its current input provided through transistor M8. As further shown, current mirror 720 includes transistors M9–M12. Memory element 730 includes capacitors C18 and C58 and transistors M81 and M80 operating as diodes in series, with transistor M80 controlling small leakages at high voltage levels of transistor M81. Transistors M60 and M83 also help reduce the voltage applied to at least capacitor C18. Memory element 730 further includes (i) transistors M79 and M38, which operate as a controlled discharge circuit for capacitor C18 after every series of coarse and corresponding fine cycles, and (ii) transistors M83, M60 and M62 which are used as a voltage stepback circuit to discharge capacitor C58 before every write operation during coarse and fine cycles. Capacitor C58 provides $V_{stepback}$ as shown in FIG. 6.

The adaptive ramp amplitude controller 540 includes a plurality of inputs and a single output as shown below in Table A.

TABLE A

| Functionality | |
|---|---|
| Inputs | |
| Column High Voltage (CHV) | The input voltage of the adaptive amplitude ramp controller. |
| Reference Voltage (V3P5) | A reference voltage used to define the initial voltage of the coarse ramp pulse. |
| Current Ramp (IRAMP) | A signal providing a sufficient amount of current used to produce a well-defined ramp voltage for NV memory cell programming. |
| COARSE | An enable signal that, when asserted, enables the first current source and indicates that a coarse cycle is being performed. |
| LATCHB | An active-low signal which, when asserted (LOW), is used to indicate that a target voltage has been reached. |
| Power Down (PD) | A signal used to ensure a low power-down current. |
| LATCH | An active-high signal which, when asserted (HIGH), is used to indicate that a target voltage has been reached. |
| Start 5 (S5) | A signal used to discharge a capacitor before every series of coarse and fine cycles. |
| Output Signal | |
| Column High Voltage (CHV2) | The output voltage of the adaptive ramp amplitude controller. |

Before beginning the coarse cycle for a programming operation by the adaptive amplitude ramp controller, S5 is at least momentarily asserted to turn-on transistor M38. Since transistor M79 is continuously turned-on, the voltage of capacitor C18 is discharged. In addition, V3P5 is set to a voltage of 3.5V and IRAMP is set to produce an appropriate current (e.g., 2 $\mu$A) through transistor M8 and transistor M82 is continuously turned-on. LATCH is asserted (HIGH) to turn-on transistors M15 and M62 in order to discharge voltage stored on both capacitor C17 and capacitor C58, respectively. Moreover, PD is deasserted to turn-off transistor M75 and LATCHB is temporarily asserted (LOW) since ramping has not yet commenced because the input voltage CHV remains at zero volts.

Upon commencing the coarse cycle to program the targeted NV memory cell, COARSE is asserted to turn-on transistor M35, LATCHB is deasserted (HIGH) to turn-on transistors M74 and M60 and LATCH is deasserted (LOW) to turn-off transistors M15 and M62. In addition, S5 and PD remain deasserted to prevent unwanted discharge of capacitor C18 and an unwanted power down condition. During the coarse cycle, CHV is a ramp voltage increasing at the first ramp rate preferably 1 V/$\mu$s. Initially, CHV2 tracks CHV based on transistor M71 being turned-on. Once the voltage at the gate of transistor M84 reaches a $V_{tn}$ higher than CHV2, CHV2 continues to track CHV at the first ramp rate through emitter-follower transistor M84. "$V_{tn}$" is a threshold voltage of transistor M84. At this time, the ramp rate of CHV2 is determined by the current from current mirror 720 and the total constant capacitance of capacitor C17–C19 and C58.

The current produced by both the first current source 700 and the second current source 710 is mirrored by current mirror 720. This is due to the fact that LATCHB signal has been deasserted so that transistor M74 is turned-on to enable current to flow through transistor M74. More specifically, current mirror 720 mirrors the collective current produced by the first and second current sources 700 and 710 to charge a voltage divider formed by capacitors C17 and C19 as well as capacitors C18 and C58 associated with memory element 730. When the voltage divider of capacitors C17 and C19 reaches a desired voltage, the first current source 700 is shut-off by turning off transistor M7. This desired voltage may be 7V (See FIG. 6) or any voltage chosen where the cell begins programming. By turning off transistor M7, no current is flowing through transistors M2 and M3. In fact, at this point, transistor M4 assists transistor M3 to collapse to ground.

Although first current source 700 has been disabled, the well-defined, controlled current provided by second current source 710 from IRAMP continues to be mirrored by current mirror 720 and this mirrored current is routed to the voltage divider of fully-charged capacitors C17 and C19 and to capacitors C18 and C58. The change in current (from a collective current associated with current sources 700 and 710 to current produced by only the second current source 710) influences the change in voltage associated with CHV2 signal undergoing the second ramping rate (e.g., 0.2 V/$\mu$s).

When comparator 520 of FIG. 5 determines that the voltage present at the NV memory cell reaches the initial target voltage, the comparator asserts LATCHB. This disables current mirror 720 by turning off transistor M74 and M60 in order to discontinue ramping CHV2 and to avoid applying extraneous voltage on capacitors C18 and C58. In addition, LATCH is asserted (HIGH) to discharge capacitors C17 and C58. Node A between capacitors C17 and C19 is grounded. Since the gate of transistor M84 is capacitively coupled to voltage divider C17 and C19, the gate voltage of M84 is lowered. This causes CHV2 to drop.

At the end of the cycle, reduction to zero volts is accomplished by CHV ramping down which causes CHV2 to follow through diode M78. Once diode M78 hits its threshold voltage (vt), transistor M71 will assist in collapsing CHV2 to 0V.

Before the fine cycle begins, LATCH is asserted while V3P5 continues to provide a 3.5V reference and LATCHB is asserted (LOW). As a result, the voltage stored on node B is reduced by a controlled amount set by the ratio of capacitors C58 and C18. The voltage on C58 is limited by the voltage applied to gate of transistor M83 by V3P5. More specifically, capacitor C58 and transistor M83 are placed in parallel with capacitor C18. This causes a change in voltage due to the following relationship:

$$\Delta V = \Delta Q/C18 = [(3.5 - V_{tn}) \times C58]/C18,$$

where

ΔV=change in voltage of C18;

ΔQ=change in charge of C18; and

C18, C58 are capacitance values of these capacitors

COARSE is deasserted to begin the fine cycle while current mirror 720 replicates the constant current supplied by RAMP since LATCHB has been asserted. In this embodiment, CHV is provided at a voltage having third ramp rate (e.g., 2 V/$\mu$s). This voltage is provided when circuitry external to the adaptive amplitude ramp controller detects COARSE has been deasserted. CHV2 is configured to track CHV because the gate of transistor M84 sees no load from capacitor C18 because the diodes formed by transistors M80 and M81 are forward biased. When the voltage on the gate of transistor M84 surpasses the voltage on capacitor C18 and two diode drops, the ramp rate is decreased to 0.2 V/$\mu$s for cell programming.

As before, when the comparator 520 of FIG. 5 determines that the present voltage on the NV memory cell reaches the new target voltage calculated as described above, LATCHB is asserted. This disables current mirror 720 by turning off transistor M74 and CHV2 drops appropriately due to discharge of capacitor C19 if the NV memory cell reached its target voltage before the end of the fine cycle. Otherwise, CHV2 follows CHV ramping down to 0V at the end of the fine cycle.

Before the succeeding fine ramp pulse begins, LATCHB is asserted (LOW) while V3P5 continues to provide a 3.5V reference and LATCH is asserted (HIGH). As a result, the voltage stored on charge storing gate C18 is reduced by the same controlled amount as described above.

Since the programming technique provided by the adaptive ramp amplitude controller is 100 times faster than conventional programming techniques, there is no need to have parallel column drivers. This reduces the circuit complexity, saves IC die area, reduces the number for possible failures and saves power by avoiding unused coarse and fine pulses. Test times are also reduced for not having to trim the voltage stepback and fine voltage step up.

The present invention described herein may be designed in many different embodiments evident to one skilled in the art than those described without departing from the spirit and scope of the present invention. For example, although particular exemplary clock frequencies have been set forth, principles of the invention may be applied to systems employing different frequencies. The invention should, therefore be measured in terms of the claims which follow.

What is claimed is:

1. A method for programming a memory cell, the method comprising the steps of:
   (a) starting a coarse programming cycle by generating a coarse ramp pulse applied to the memory cell, the coarse ramp pulse having a voltage level continuously increasing at a first ramp rate after reaching a first predetermined voltage;
   (b) measuring a voltage generally applied to the memory cell during step (a);
   (c) temporarily halting programming of the memory cell when a predetermined condition occurs; and
   (d) starting a fine programming cycle by generating at least one fine ramp pulse in order to further program the memory cell, a first fine ramp pulse having a voltage level continuously increasing at a second ramp rate after the voltage level of the first fine pulse reaches a second predetermined voltage, the second predetermined voltage being based on a final voltage level applied during the coarse programming cycle.

2. The method of claim 1, wherein the step (a) includes the steps of
   (a1) increasing the voltage level of the coarse ramp pulse at a first initial ramp rate; and
   (a2) adjusting the voltage level of the coarse ramp pulse to increase at the first ramp rate after reaching the first predetermined voltage.

3. The method of claim 2 further including the step of:
   (a3) programming the memory cell as the voltage level of the coarse ramp pulse is increasing at the first ramp rate.

4. The method of claim 1, wherein the first initial ramp rate is greater than the first ramp rate.

5. The method of claim 1, wherein the predetermined condition of step (c) includes a completion of the coarse programming cycle.

6. The method of claim 5, wherein the predetermined condition of step (c) alternatively includes reaching a target voltage level set prior to starting the coarse programming cycle.

7. The method of claim 1, wherein the measuring of the voltage level includes performing a read-while-write operation.

8. The method of claim 1, wherein the step (d) includes the steps of
   (d1) increasing the voltage level of the first fine ramp pulse at a second initial ramp rate; and
   (d2) adjusting the voltage level of the first fine ramp pulse to increase at the second ramp rate after reaching the second predetermined voltage.

9. The method of claim 8, wherein the second initial ramp rate is greater than the second ramp rate.

10. The method of claim 9, wherein the second predetermined voltage is equivalent to the final voltage level applied during the coarse programming cycle minus a predetermined stepback voltage.

11. The method of claim 10, wherein the predetermined stepback voltage is a constant voltage.

12. The method of claim 1 further comprising the steps of:
    (e) measuring a voltage generally applied to the memory cell during the first fine ramp pulse;
    (f) temporarily halting programming of the memory cell when another predetermined condition occurs;
    (g) generating a second fine ramp pulse having a voltage level increased at the second initial ramp rate; and
    (h) adjusting the voltage level of the second fine ramp pulse to increase at the second ramp rate after the voltage level of the second time ramp pulse reaching a third predetermined voltage, the third predetermined voltage being based on a final voltage level applied during the first fine ramp pulse minus a constant stepback voltage.

13. An adaptive ramp amplitude controller providing a series of output ramp voltages used during a corresponding series of write operations on a memory cell, comprising:
    an input line to receive an input ramp voltage;
    an output line to provide the series of output ramp voltages;
    a current mirror coupled to the input line;
    a plurality of current sources each selectively coupled to the current mirror;
    a first transistor coupled to the current mirror, the input line and the output line; and
    at least one capacitor being discharged to effect at least one of (i) an output ramp voltage of the series of output ramp voltages and (ii) a write operation of the series of write operations.

14. The adaptive ramp amplitude controller of claim 13, wherein the plurality of current sources includes a first current source and a second current source.

15. The adaptive ramp amplitude controller of claim 14, wherein the output ramp voltage is increasing at a first ramp rate when both the first current source and the second current source are functional and the output ramp voltage is increasing at a second ramp rate when only the second current source is functional.

16. The adaptive ramp amplitude controller of claim 15, wherein the first ramp rate is greater than the second ramp rate.

17. The adaptive ramp amplitude controller of claim 13, wherein a gate of the first transistor is coupled to the current mirror and the at least one capacitor, a source of the first transistor is coupled to the output signal line and a drain of the first transistor is coupled to the input signal line.

18. The adaptive ramp amplitude controller of claim 13 further comprising
 a controlled discharge circuit coupled between a reference ground and a node coupled to a first capacitor of the at least one capacitor; and
 a voltage stepback circuit coupled between the node and the reference ground, the voltage stepback circuit to partially reduce a voltage level of the output ramp voltage by a predetermined voltage prior to each write operation in the series of write operations.

19. The adaptive ramp amplitude controller of claim 18 controlled discharge circuit includes a second transistor coupled to the node, the reference ground and a reset input line, the first capacitor being fully discharged when the second transistor is turned-on.

20. The adaptive ramp amplitude controller of claim 18, wherein the voltage stepback circuit includes
 a second transistor coupled to the node, the second transistor having a gate receiving a constant reference voltage;
 a third transistor coupled in series with the second transistor and a second capacitor, the third transistor being turned-on in order to reduce voltage maintained on the first capacitor by a controlled amount set by a ratio of capacitances of the first capacitor and second capacitor; and
 a fourth transistor coupled in parallel with the second capacitor in order to partially discharge voltage stored on the second capacitor on an intermittent basis.

21. The adaptive ramp amplitude controller of claim 18, wherein the memory element further includes at least one diode coupled between a gate of the first transistor and the first capacitor.

22. A circuit for programming a selected memory cell, the circuit comprising:
 a column driver to monitor a voltage level of the selected memory cell during a programming state; and
 an adaptive ramp amplitude controller coupled to the column driver, the adaptive ramp amplitude controller to provide a single coarse ramp pulse and at least one fine ramp pulse to program the selected memory cell.

23. The circuit of claim 22, wherein coarse ramp pulse is increased at a first ramp rate until a first predetermined voltage level is reached and is increased at a second ramp rate after reaching the first predetermined voltage in order to program the selected memory cell.

24. The circuit of claim 23, wherein a first fine ramp pulse of the at least one fine ramp pulse is increased at a third ramp rate until a second predetermined voltage level is reached and is subsequently increased at the second ramp rate after reaching the second predetermined voltage in order to further program the selected memory cell.

25. The circuit of claim 24, wherein the second predetermined voltage level is approximately equal to a final voltage level applied to the selected memory cell during the coarse ramp pulse minus a constant stepback voltage.

26. The circuit of claim 22, wherein the adaptive ramp amplitude controller includes:
 an input line to receive an input ramp voltage;
 an output line to provide the coarse ramp voltage and the at least one fine ramp voltage to the column driver;
 a current mirror coupled to the input line;
 a plurality of current sources each selectively coupled to the current mirror;
 a first transistor coupled to the current mirror, the input line and the output line; and
 an internal memory element coupled to the current mirror and the transistor the internal memory element including at least one capacitor being discharged to effect one of an output ramp voltage of the series of output ramp voltages and a write operation of the series of write operations.

27. The circuit of claim 26, wherein the plurality of current sources of the adaptive ramp amplitude controller include a first current source and a second current source.

28. The circuit of claim 27, wherein the coarse ramp voltage is increasing at a first ramp rate when both the first current source and the second current source are functional and is increasing at a second ramp rate when only the second current source is functional.

29. The circuit of claim 26, wherein the internal memory element of the adaptive ramp amplitude controller includes
 a first capacitor coupled to a node and a reference ground;
 a second capacitor coupled to the reference ground:
 a controlled discharge circuit coupled between the node and the reference ground; and
 a voltage stepback circuit coupled between the node and reference ground, the voltage stepback circuit partially discharges the second capacitor by a predetermined voltage prior to each write operation in the series of write operations.

30. The circuit of claim 29, wherein the controlled discharge circuit of the internal memory element includes a second transistor coupled to the node, the reference ground and a reset input line, the first capacitor being fully discharged when the second transistor is turned-on.

31. The circuit of claim 29, wherein the voltage stepback circuit of the internal memory element includes
 a current mirror;
 a plurality of current sources each selectively coupled to the current mirror;
 a first transistor coupled to the current mirror;
 at least one capacitor coupled to the current mirror and the first transistor, the at least one capacitor being discharged by a predetermined voltage prior to each write operation of the series of write operations.

32. The circuit of claim 29, wherein the internal memory element further comprises at least one diode connected between a gate of the transistor and the first capacitor.

33. The adaptive ramp amplitude controller of claim 32 further comprising:
 an input line coupled to the current mirror and the transistor, the input line to receive an input ramp voltage; and an output line coupled to the transistor, the output line to provide the series of output ramp voltages.

34. The adaptive ramp amplitude controller of claim 32, wherein the at least one capacitor includes a first capacitor coupled between a node and a reference ground and a second capacitor coupled to the reference ground.

35. The adaptive ramp amplitude controller of claim 34 further comprising:

a controlled discharge circuit coupled between the node and the reference ground, the controlled discharge circuit to discharge the first capacitor after each output ramp voltage.

36. The adaptive ramp amplitude controller of claim 35, wherein the controlled discharge circuit includes a second transistor connected to the node, the reference ground and a reset input line, the first capacitor being fully discharged when the second transistor is turned-on.

37. The adaptive ramp amplitude controller of claim 34 further comprising:

a voltage stepback circuit coupled between the node and reference ground, the voltage stepback circuit to partially discharge the second capacitor by the predetermined voltage before each write operation of the series of write operations.

38. The adaptive ramp amplitude controller of claim 37, wherein the voltage stepback circuit includes a second transistor coupled to the node, the second transistor including a gate to receive a constant reference voltage;

a third transistor coupled in series with the second transistor and the second capacitor, the third transistor being turned-on in order to reduce voltage maintained on the first capacitor by a controlled amount set by a ratio of capacitance between the first capacitor and the second capacitor; and a fourth transistor connected in parallel with the second capacitor in order to partially discharge voltage stored on the second capacitor on an intermittent basis.

39. A circuit for programming a selected memory cell, the circuit comprising:

a column driver to monitor a voltage level of the selected memory cell during a programming state; and an adaptive ramp amplitude controller coupled to the column driver, the adaptive ramp amplitude controller including at least one capacitor being discharged to effect either an output ramp voltage of the series of output ramp voltages provided by the amplitude controller or a write operation of the series of write operations performed by the amplitude controller.

* * * * *